(12) United States Patent
McNeil et al.

(10) Patent No.: US 11,417,406 B2
(45) Date of Patent: Aug. 16, 2022

(54) REDUCING PROGRAM VERIFIES FOR MULTI-LEVEL NAND CELLS

(71) Applicant: Micron Technology, Inc., Boise, ID (US)

(72) Inventors: Jeffrey S. McNeil, Nampa, ID (US); Jason Lee Nevill, Boise, ID (US); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/907,594

(22) Filed: Jun. 22, 2020

(65) Prior Publication Data

US 2021/0398599 A1    Dec. 23, 2021

(51) Int. Cl.

| | |
|---|---|
| *G11C 16/04* | (2006.01) |
| *G11C 16/34* | (2006.01) |
| *G11C 11/56* | (2006.01) |
| *G06F 3/06* | (2006.01) |
| *G11C 16/10* | (2006.01) |
| *G11C 16/26* | (2006.01) |

(52) U.S. Cl.
CPC ........ *G11C 16/3459* (2013.01); *G06F 3/0604* (2013.01); *G06F 3/0659* (2013.01); *G06F 3/0679* (2013.01); *G11C 11/5628* (2013.01); *G11C 11/5671* (2013.01); *G11C 16/0483* (2013.01); *G11C 16/10* (2013.01); *G11C 16/26* (2013.01); *G11C 2211/5621* (2013.01)

(58) Field of Classification Search
CPC ............ G11C 16/0483; G11C 11/5671; G11C 16/3459; G11C 2211/5621; G11C 11/5628; G11C 16/10; G06F 3/0679
See application file for complete search history.

(56) References Cited

U.S. PATENT DOCUMENTS

| | | | |
|---|---|---|---|
| 9,721,672 B1 * | 8/2017 | Dutta ................. | G11C 16/0483 |
| 2011/0007571 A1 * | 1/2011 | Park .................... | G11C 11/5628 |
| | | | 365/185.22 |
| 2017/0110185 A1 * | 4/2017 | Hahn ................. | G11C 16/0483 |

* cited by examiner

*Primary Examiner* — Uyen Smet
(74) *Attorney, Agent, or Firm* — Schwegman Lundberg & Woessner, P.A.

(57) ABSTRACT

Over time, the number of write cycles required to successfully program a multi-level cell (MLC) is reduced. Since a hard-coded value does not change over the lifetime of the device, the device may perform too many verify steps at one stage of the device lifetime and wait too long to begin verification at another stage of the device lifetime, reducing performance of the device. As discussed herein, verification for higher voltage level programming is delayed until verification for lower voltage level programming reaches at least a threshold level of success instead of using a hard-coded number of verify steps to skip. As a result, the performance drawbacks associated with skipping a hard-coded number of verify cycles may not occur.

20 Claims, 8 Drawing Sheets

US 11,417,406 B2

REDUCING PROGRAM VERIFIES FOR MULTI-LEVEL NAND CELLS

TECHNICAL FIELD

Embodiments of the disclosure relate generally to multi-level NAND cells and more specifically to skipping program verify levels for multi-level NAND cells.

BACKGROUND

Single-level cells (SLCs) are maintained either above or below a threshold voltage and store one bit of information. A multi-level cell (MLC) has multiple possible voltage ranges. For example, an MLC with four possible states can hold two bits of information; while an MLC with eight possible states can hold four bits of information.

To set the value of an MLC, a write voltage is applied. After applying the write voltage, the value of the MLC is checked, and if necessary, the write voltage is applied again. This process continues until the MLC reaches the desired voltage.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
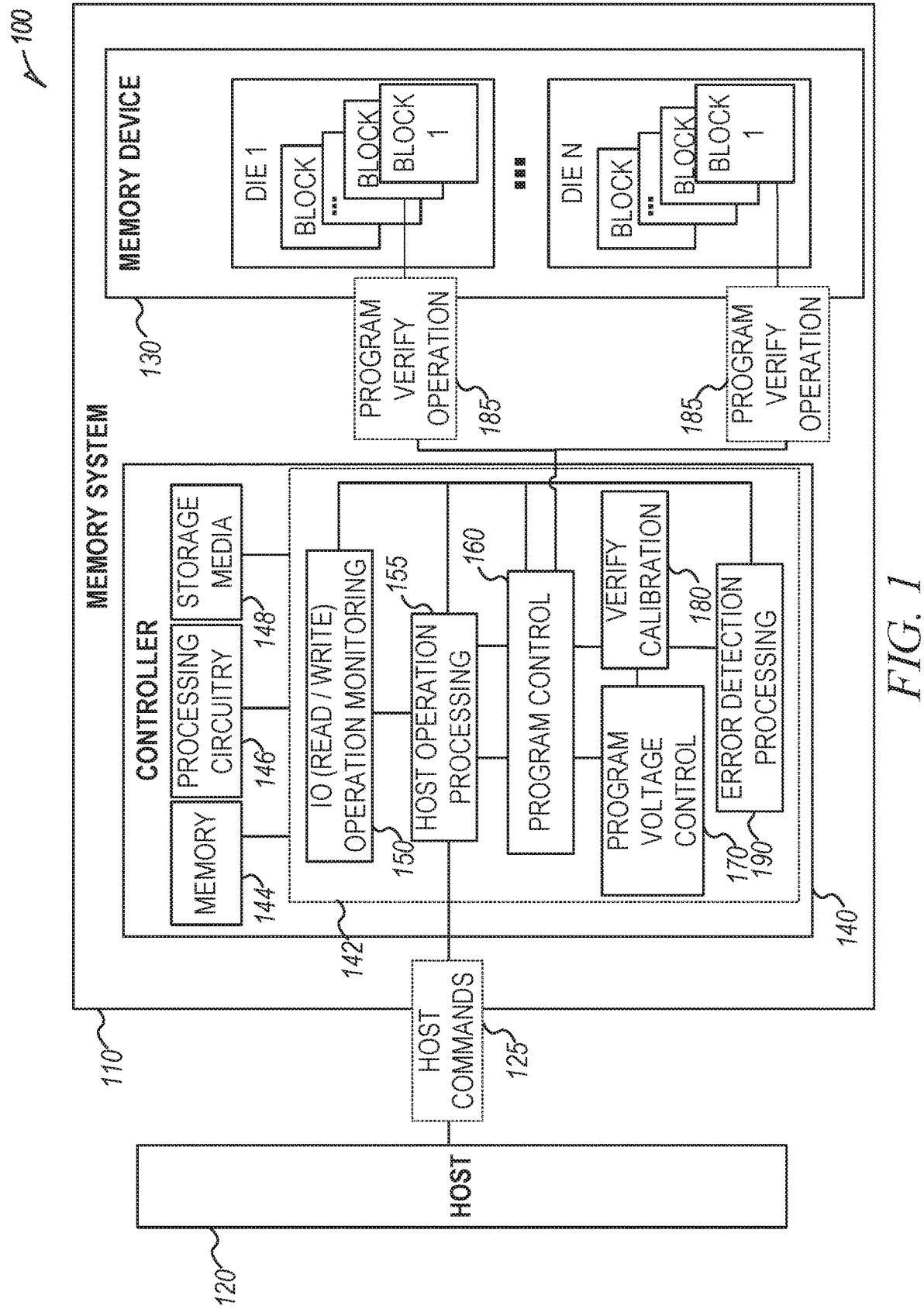
FIG. 1 is a block diagram of an example system including a memory device adapted for reducing program verifies for multi-level NAND cells.

A typical transistor, such as an N-channel metal-oxide-semiconductor field-effect transistor (MOSFET) have a constant threshold voltage. The threshold voltage is the minimum voltage applied to the gate of the transistor that allows current to flow from the source to the drain. Thus, a typical transistor is a control device, not a storage device. A NAND cell includes a charge storage element, the charge of which affects the threshold voltage of the NAND cell. Such charge storage elements can be, for example, a charge trap region or structure, selectively storing charge in a dielectric material; or alternatively a floating gate, typically selectively storing charge in a polysilicon structure. All of the above charge storage structures or regions are generically referred herein to as "charge storage elements." Thus, by applying a voltage to the gate and detecting if current flows from the source to the drain, the NAND cell can be used as a data storage device.

Additionally, multiple different charge levels of the charge storage element are possible, allowing for multiple bits of data to be stored in a single NAND cell. For example, the cell may hold a 00 value when the threshold voltage is 0V, a 01 value when the threshold voltage is 0.5V, a 10 value when the threshold voltage is 1.0V, and a 11 value when the threshold voltage is 1.5V.

Because of physical differences in individual NAND cells, the process of programming an MLC is iterative. A programming voltage is applied to add or remove charge from the charge storage elements. A verify voltage is applied to determine the threshold voltage of the programmed NAND cell. If the threshold voltage corresponds to the intended stored value, the programming is complete. Otherwise, the process repeats. In this way, each NAND cell can be successfully programmed even if the NAND cells in a device have different physical characteristics.

To save time in performing the program/verify cycles, a number of program cycles may be performed without intervening verify cycles. If the number of skipped verify steps is higher than optimal, successful programming will not be immediately ascertained, and more programming steps than necessary will be performed. If the number of skipped verify steps is lower than optimal, more verify steps than necessary will be performed. Accordingly, accurate estimation of how many verify steps to skip reduces the write time of the NAND device, improving performance.

One method of estimating the number of verify steps to skip is to characterize the device at fabrication time. The characterization estimation is hard-coded into the device and, for the life of the device, that number of verify steps is skipped when writing data. However, over time, the number of write cycles required to successfully program an MLC is reduced. Since the hard-coded value does not change over the lifetime of the device, the device may perform too many verify steps at one stage of the device lifetime and wait too long to begin verification at another stage of the device lifetime, reducing performance of the device.

As discussed herein, verification for higher voltage level programming (e.g., 1.0V) is delayed until verification for lower voltage level programming (e.g., 0.5V) reaches at least a threshold level of success. Since the number of program/verify cycles performed to reach the threshold level of success is a measurement of the physical performance of the device, the number of verify cycles skipped for the higher voltage programming levels will vary dynamically as the characteristics of the device change. As a result, the performance drawbacks associated with skipping a hard-coded number of verify cycles are less likely to occur.

FIG. 1 provides a block diagram of an example system 100 including a memory system 110 (e.g., a SSD storage device, a SD/MMC card, etc.) having a memory controller 140 with control modules 142 adapted for implementing the write verify optimization techniques discussed herein. In an example, the functionality of the control modules 142 may be implemented in respective modules in a firmware of the memory controller 140. However, it will be understood that various forms of software, firmware, and hardware may be utilized by the controller 140 to implement the control modules 142 (e.g, implement the functionality of program control 160) and the other techniques discussed herein.

As shown, the memory system 110 includes a NAND memory device 130 with multiple dies (dies 1-N), with each die including one or more blocks (blocks 1-N). Each of the one or more blocks may include further divided portions, such as one or more wordlines (not shown) per block; and each of the one or more wordlines may be further comprised of one or more pages (not shown) per wordline, depending on the number of data states that the memory cells of that wordline are configured to store.

In an example, the blocks of memory cells of the memory device 130 include groups of at least one of: single-level cell (SLC), multi-layer cell (MLC), triple-layer cell (TLC), or quad-layer cell (QLC) NAND memory cells. Also, in an example, the memory device 130 is arranged into a stack of three-dimensional (3D) NAND dies. These configurations and further detailed components of the memory device 130 are not illustrated in FIG. 1 for simplicity. However, the memory device 130 may incorporate these or any of the features described above with reference to features of 3D NAND architecture devices or other forms of NAND storage devices.

In 3D architecture semiconductor memory technology, vertical structures are stacked, increasing the number of tiers, physical pages, and accordingly, the density of a memory device (e.g., a storage device). In an example, the memory system 110 can be a discrete memory or storage device component of the host device 120. In other examples, the memory system 110 can be a portion of an integrated circuit (e.g., system on a chip (SOC), etc.), stacked or otherwise included with one or more other components of the host device 120.

Each flash memory cell in a NAND architecture semiconductor memory array may be programmed to two or more programmed states. For example, an SLC may represent one of two programmed states (e.g., 1 or 0), representing one bit of data. Flash memory cells may also represent more than two programmed states, allowing the manufacture of higher density memories without increasing the number of memory cells, as each cell may represent more than one binary digit (e.g., more than one bit). Such cells may be referred to as multi-state memory cells, multi-digit cells, or multi-level cells (MLCs). In certain examples, MLC may refer to a memory cell that may store two bits of data per cell (e.g., one of four programmed states), TLC may refer to a memory cell that may store three bits of data per cell (e.g., one of eight programmed states), and a QLC may store four bits of data per cell. MLC is used herein in its broader context, to refer to any memory cell(s) that may store more than one bit of data per cell (i.e., that may represent more than two programmed states; thus, the term MLC is used herein in the broader context, to be generic to memory cells storing 2, 3, 4, or more bits of data per cell).

The memory system 110 is shown as being operably coupled to a host 120 via a controller 140 of the memory device. The controller 140 is adapted to receive and process host IO commands 125, such as read operations, write operations, erase operations, and the like, to read, write, erase, and manage data stored within the memory device 130. In other examples, the memory controller 140 may be physically separate from an individual memory device, and may receive and process commands for one or more individual memory devices. A variety of other components for the memory system 110 (such as a memory manager, and other circuitry or operational components) and the controller 140 are also not depicted for simplicity.

The controller 140 is depicted as including a memory 144 (e.g., volatile memory), processing circuitry 146 (e.g., a microprocessor), and a storage media 148 (e.g., non-volatile memory), used for executing instructions (e.g., instructions hosted by the storage media 148, loaded into memory 144, and executed by the processing circuitry 146) to implement the control modules 142 for management and use of the memory device 130. The functionality provided by the control modules 142 may include, but is not limited to: IO operation monitoring 150 (e.g., to monitor read and write IO operations, originating from host commands); host operation processing 155 (e.g., to interpret and process the host IO commands 125, and to issue further commands to the memory array 530 to perform respective read, write, erase, or other host-initiated operations); program control 160 (e.g., to control the timing, criteria, conditions, and parameters of respective program verify operations 185 on the memory device 130); program voltage control 170 (e.g., to establish, set, and utilize a program voltage level to program a particular portion of the memory device 130); verify calibration 180 (e.g., to operate a calibration procedure to identify a new programmed voltage level of a particular portion or portions of the memory device 130); and error detection processing 190 (e.g., to identify and correct errors from data obtained in read operations, to identify one or more raw bit error rates (RBER(s)) for a particular read operation or set of operations, etc.).

One or more communication interfaces can be used to transfer the host commands 125 between the memory system 110 and one or more other components of the host device 120, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 120 can include a host system, an electronic device, a processor, a memory card reader, or one or more other electronic devices external to the memory system 110. In some examples, the host device 120 may be a machine having some portion, or all, of the components discussed in reference to the machine 800 of FIG. 8.

In an example, the host operation processing 155 is used to interpret and process the host IO commands 125 (e.g., read and write commands) and initiate accompanying commands in the controller 140 and the memory device 130 to accomplish the host IO commands 125. Further, the host operation processing 155 may coordinate timing, conditions, and parameters of the program control 160 in response to the host IO commands 125, IO operation monitoring 150, and error detection processing 190.

The IO operation monitoring 150 operates, in some example embodiments, to track reads and writes to the memory device 130 initiated by host IO commands. The IO operation monitoring 150 also operates to track accompanying IO operations and states, such as a host IO active or inactive state (e.g., where an active state corresponds to the state of the controller 140 and memory device 130 actively performing read or write IO operations initiated from the host 120, and where an inactive state corresponds to an absence of performing such IO operations initiated from the host 120). The IO operation monitoring 150 may also monitor voltage level and read error rates occurring with the IO operations initiated from the host 120, in connection with determining parameters for the program control 160 as discussed herein.

The program control 160 can include, among other things, circuitry or components (hardware and/or software) configured to control memory operations associated with writing data to, reading data from, or erasing one or more memory cells of the memory device 130 coupled to the memory controller 140. In an example, the program control 160 operates to identify parameters in the memory device 130 and controller 140 for scheduling and conducting a program verify operation 185, such as based on the IO conditions (e.g., indicated by the IO operation monitoring 150) or error conditions (e.g., indicated by the error detection processing 190). The program control 160 further operates to initiate and perform the program verify operation 185 based on these or other parameters, through synchronous or asynchronous event processing.

The program voltage control 170, in some example embodiments, is used to establish, change, and provide a voltage value used to program a particular area of memory (such as a respective block in the memory device 130). For example, the program voltage control 170 may implement various positive or negative offsets in order to program respective memory cells and memory locations (e.g., pages, blocks, dies) including the respective memory cells.

In an example, the verify calibration 180 is used to establish (e.g., change, update, reset, etc.) whether or not a verify operation should be performed after a program operation. The verify calibration 180 may be implemented based on a number or percentage of bits in the NAND memory device 130 that were successfully programmed at a lower voltage level.

The error detection processing 190, in some example embodiments, may detect a recoverable error condition (e.g., a RBER value or an RBER trend), an unrecoverable error condition, or other measurements or error conditions for a memory cell, a group of cells, or larger areas of the memory array (e.g., averages or samples from a block, group of blocks, die, group of dies, etc.).

Additionally, the sampling and read operations that are performed in a read scan by the program control 160 may allow configuration, such as from a specification (e.g., a determined setting or calculation) of: a size of data (e.g., data corresponding to a page, block, group of blocks, die) that is programmed; a number of pages in total that are programmed; a number of pages within a block that are programmed; whether certain cells, pages, blocks, dies, or certain types of such cells, pages, blocks, dies are or are not programmed; and the like. Likewise, the program control 160 may control or allow configuration of the number of program cycles that are performed before the first verify cycle, the number of program cycles that are performed between verify cycles, the number of bits to be successfully programmed at each level before next-level verification begins, or any suitable combination thereof.

In addition to the techniques discussed herein, other types of maintenance operations may be implemented by the control modules 142 in the controller 140. Such operations may include garbage collection or reclamation, wear leveling, block management, and other forms of background activities performed upon the memory device 130. Such background activities may be triggered during an idle state detected by the IO operation monitoring 150, such as immediately following or concurrently with a read scan operation.

The program control 160 can include an error correction code (ECC) component, which can include, among other things, an ECC engine or other circuitry configured to detect or correct errors associated with writing data to or reading data from one or more memory cells of the memory device 130 coupled to the memory controller 140. The memory controller 140 can be configured to actively detect and recover from error occurrences (e.g., bit errors, operation errors, etc.) associated with various operations or storage of data, while maintaining integrity of the data transferred between the host device 120 and the memory system 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory device 130 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18.592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory system 110 in pages, and erased in blocks. However, one or more memory operations (e.g., read, write, erase, etc.) can be performed on larger or smaller groups of memory cells, as desired. The data transfer size of a NAND memory system 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory devices 130 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
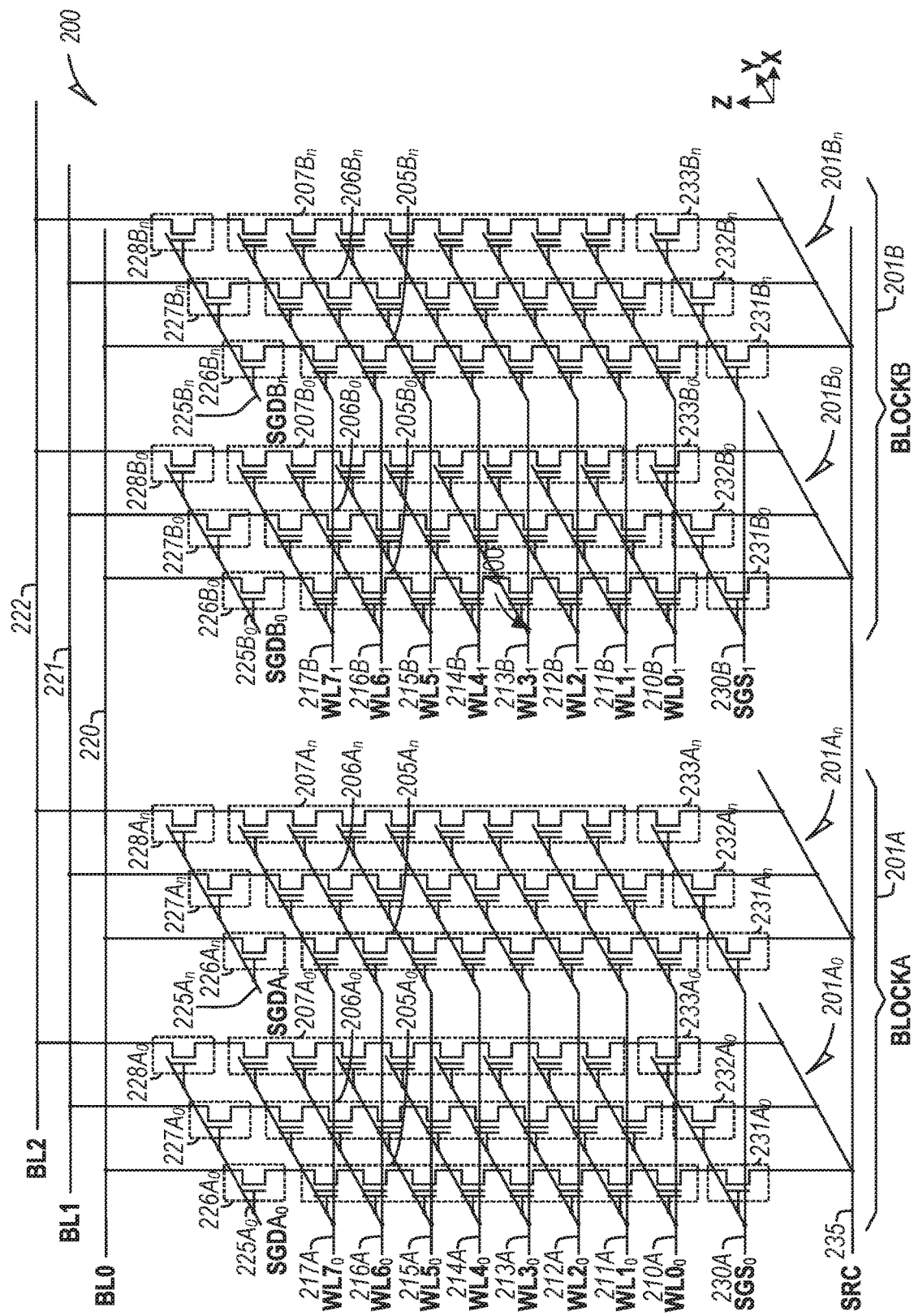
FIG. 2 illustrates a schematic diagram of an example of a three-dimensional (3D) NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bitlines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., wordlines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bitlines (BLs) and select gates, etc., and specific memory cells at one or more tiers in the specific strings can be accessed, selected, or controlled using one or more access lines (e.g., wordlines).

Figure 3:
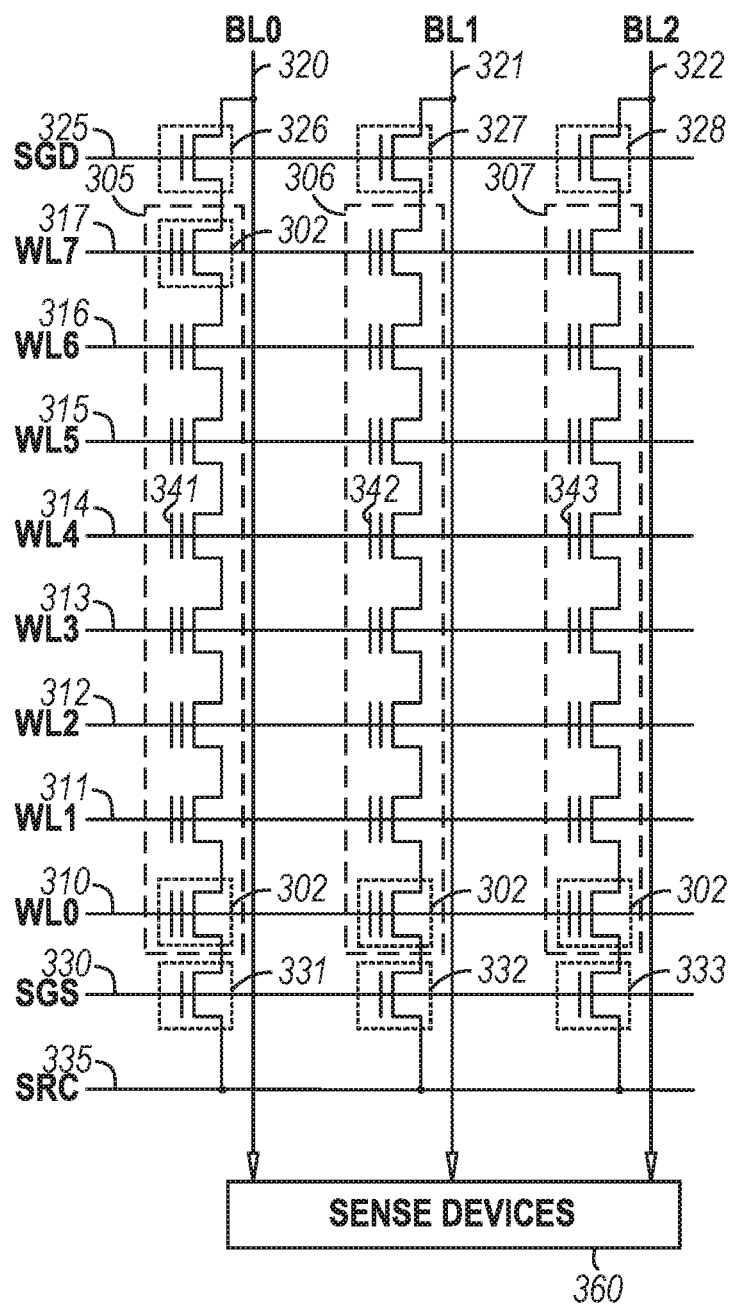
FIG. 3 illustrates a schematic diagram of an example of a three-dimensional (3D) NAND architecture semiconductor memory array.

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective wordlines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bitlines (BL) BL0-BL2 320-322) using a respective drain-side select gate (SGD) (e.g., first-third SGD 326-328). Although illustrated with 8 tiers (e.g., using wordlines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bitlines BL0-BL2), access lines (e.g., wordlines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected wordlines (e.g., WL4), and thus, to a control gate of each memory cell coupled to the selected wordlines (e.g., first-third control gates (CGs) 341-343 of the memory cells coupled to WL4). Programming pulses can begin, for example, at or near 15V. and, in certain examples, can increase in magnitude during each programming pulse application. While the program voltage is applied to the selected wordlines, a potential, such as a ground potential (e.g., Vss), can be applied to the data lines (e.g., bitlines) and substrates (and thus the channels, between the sources and drains) of the memory cells targeted for programming, resulting in a charge transfer (e.g., direct injection or Fowler-Nordheim (FN) tunneling, etc.) from the channels to the charge storage elements of the targeted memory cells.

In contrast, a pass voltage (Vpass) can be applied to one or more wordlines having memory cells that are not targeted for programming, or an inhibit voltage (e.g., Vcc) can be applied to data lines (e.g., bitlines) having memory cells that are not targeted for programming, for example, to inhibit charge from being transferred from the channels to the charge storage elements of such non-targeted memory cells. The pass voltage can be variable, depending, for example, on the proximity of the applied pass voltages to a wordline targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific wordline, such as WL4, a pass voltage of 10V can be applied to one or more other wordlines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of wordlines, etc., can be higher or lower, or more or less.

The sense amplifiers 360, coupled to one or more of the data lines (e.g., first, second, or third bitlines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

A verify operation is performed by applying a verify voltage to the control gate of each transistor being verified, applying a bias voltage to the source line 335, and providing a sensing current (e.g., 3 μA) to each of the bit-lines 320-322. As a result, the gate-to-source voltage, Vgs, of each transistor equals the verify voltage minus the bias voltage and will turn on or conduct current only if the threshold voltage Vt of the transistor is less than or equal to Vgs. The verify voltage and bias voltage should be such that Vgs is at least equal to the desired threshold voltage. Determining if any current flows through the NAND string indicates whether or not all transistors have been properly programmed. i.e., each having threshold voltages greater than or equal to the desired threshold voltage.

Figure 4:
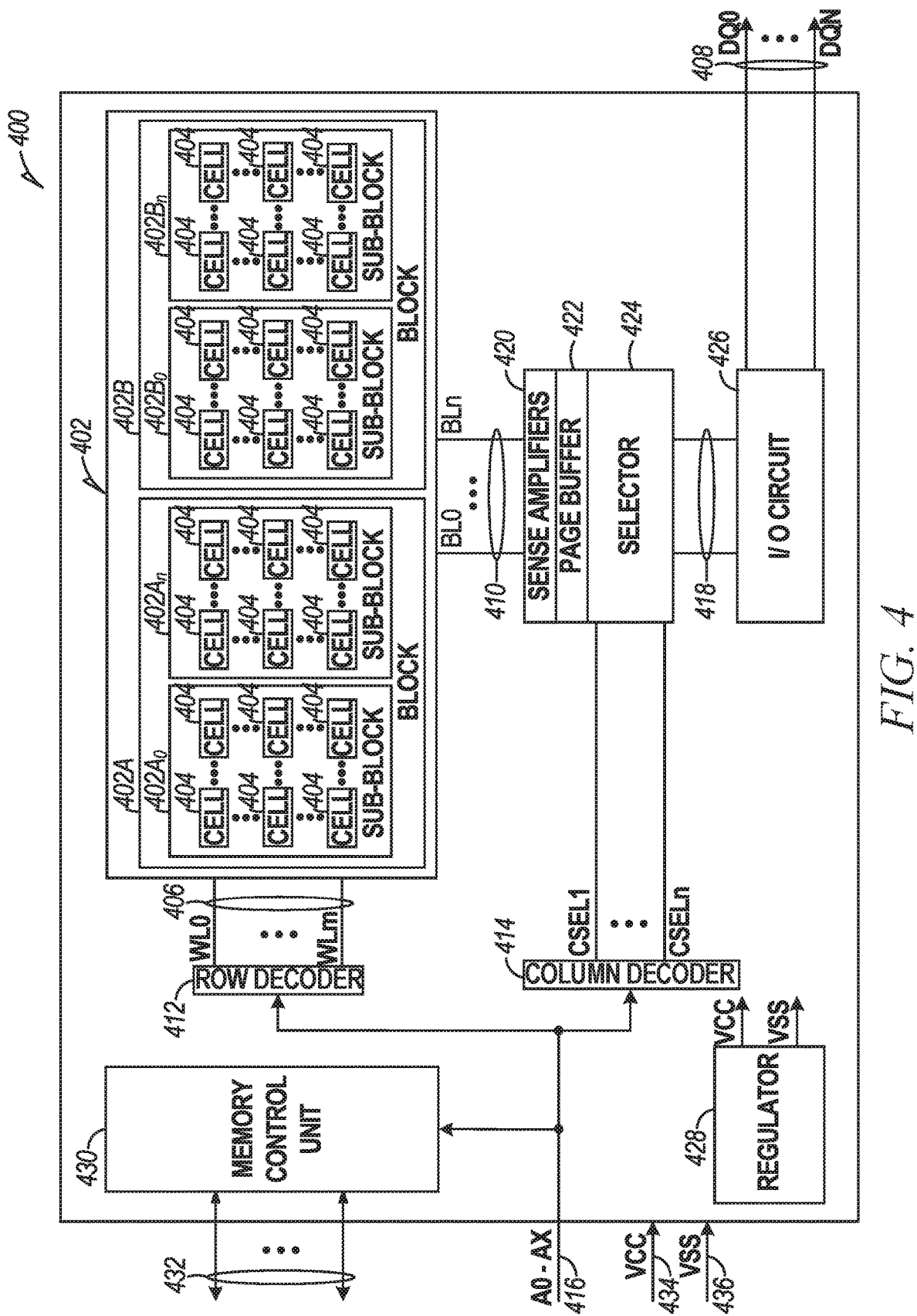
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of wordlines (WL0-WLm)) or the first data lines 410 (e.g., one or more of a plurality of bitlines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
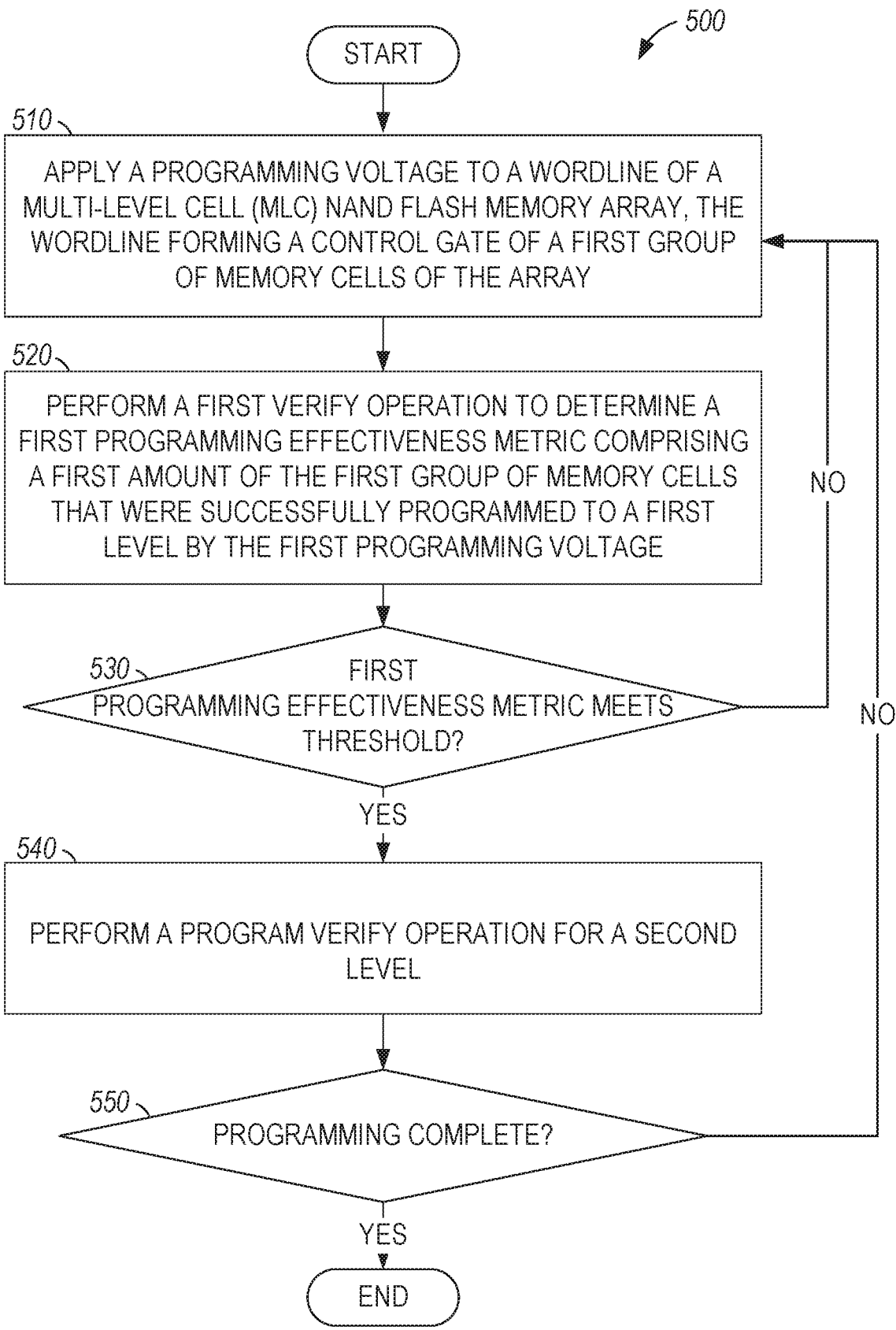
FIG. 5 is a flow chart showing operations of a method performed by a circuit in reducing program verifies for multi-level NAND cells, in accordance with some embodiments of the present disclosure.

FIG. 5 is a flow chart showing operations of a method 500 performed by a circuit in reducing program verifies for multi-level NAND cells, in accordance with some embodiments of the present disclosure. The method 500 includes operations 510, 520, 530, 540, and 550. By way of example and not limitation, the method 500 is described as being performed by the devices of FIGS. 1-4.

In operation 510, the program control 160 applies a programming voltage to a wordline of MLC flash memory (e.g., the wordline 317 of FIG. 3), the wordline forming a control gate of a first group of memory cells of the array. As discussed above with respect to FIG. 3, while the program voltage (e.g., 15V) is applied to the selected wordlines, a potential, such as a ground potential, can be applied to the bitlines and substrates (and thus the channels, between the sources and drains) of the memory cells targeted for programming, resulting in a charge transfer from the channels to the charge storage elements of the targeted memory cells. Simultaneously, a pass voltage or an inhibit voltage (e.g., a voltage equal to the program voltage) can be applied to bitlines having memory cells that are not targeted for programming to inhibit charge from being transferred from the channels to the charge storage elements of such non-targeted memory cells.

The program control 160 performs, in operation 520, a first verify operation to determine a first programming effectiveness metric comprising a first amount of the first group of cells that were successfully programmed to a first level by the first programming voltage. For example, the program verify operation 185 may be performed for the first level, testing to see if the threshold voltage for each programmed transistor has been raised to at least the first level. In each iteration of programming, likely only a subset of memory cells coupled to the wordline are programmed. The program verify operation 185 determines the amount of memory cells (e.g., the number of memory cells or the percentage of memory cells) that have been successfully programmed over the current and previous iterations. Once bits have been successfully programmed, those memory cells are removed from the set of memory cells to be programmed in further iterations. Accordingly, the threshold voltage of the successfully programmed transistors will be unaffected by later programming passes.

In operation 530, the program control 160 determines if the first programming effectiveness metric meets a predetermined threshold (e.g., if at least 30% of the first group of memory cells to be programmed to the first level have been successfully programmed). The predetermined threshold may be accessed from non-volatile storage within the controller 140 (e.g., a non-volatile portion of the storage media 148) that was programmed prior to power-on of the memory system 110 (e.g., during production). Alternatively, the predetermined threshold may have been received from the host 120 via a bus and stored in volatile memory (e.g., a volatile portion of the memory 144) for access by the program control 160.

If the threshold is met, the method 500 continues with operation 540 and the program control 160 performs a program verify operation for a second level. For example, if at least the threshold amount of the first memory cells were successfully programmed to the first level, the program verify operation 185 determines the amount of the first memory cells that have been successfully programmed to a second level. In the alternative, based on the first amount and the predetermined threshold, the program control 160 skips the program verify operation for the second level and returns to operation 510. For example, if less than the threshold amount of the first memory cells were successfully programmed to the first level, operation 540 is not performed. Thus, if the amount of memory cells successfully programmed to the first level is below the threshold, the step of verifying the programming to the second level is skipped, saving time by comparison with methods that perform program verify operations at all levels after each programming iteration.

By virtue of operation 550, in which the program control 160 determines if the programming is complete, the method 500 is repeated until all MLCs are successfully programmed to the intended levels. The meaning of "first level" and "second level" may change between iterations. For example, once all cells being programmed to a first level have been successfully programmed to that level, no further verification of the original "first level" is needed. On subsequent iterations, the second level is verified in operation 520 and a third level is conditionally verified in operations 530 and 540. In this way, unneeded verification steps (such as verifying a set of bits that has already been 100% verified) are skipped, decreasing the time used to write the line of MLCs.

As described above, the method 500 is performed by the program control 160 of the controller 140, controlling the memory device 130 within a memory system 110. Alternatively, the method 500 may be performed by the memory control unit 430 within the memory device 400, communicating with memory controller (e.g., the controller 140).

Figure 6:
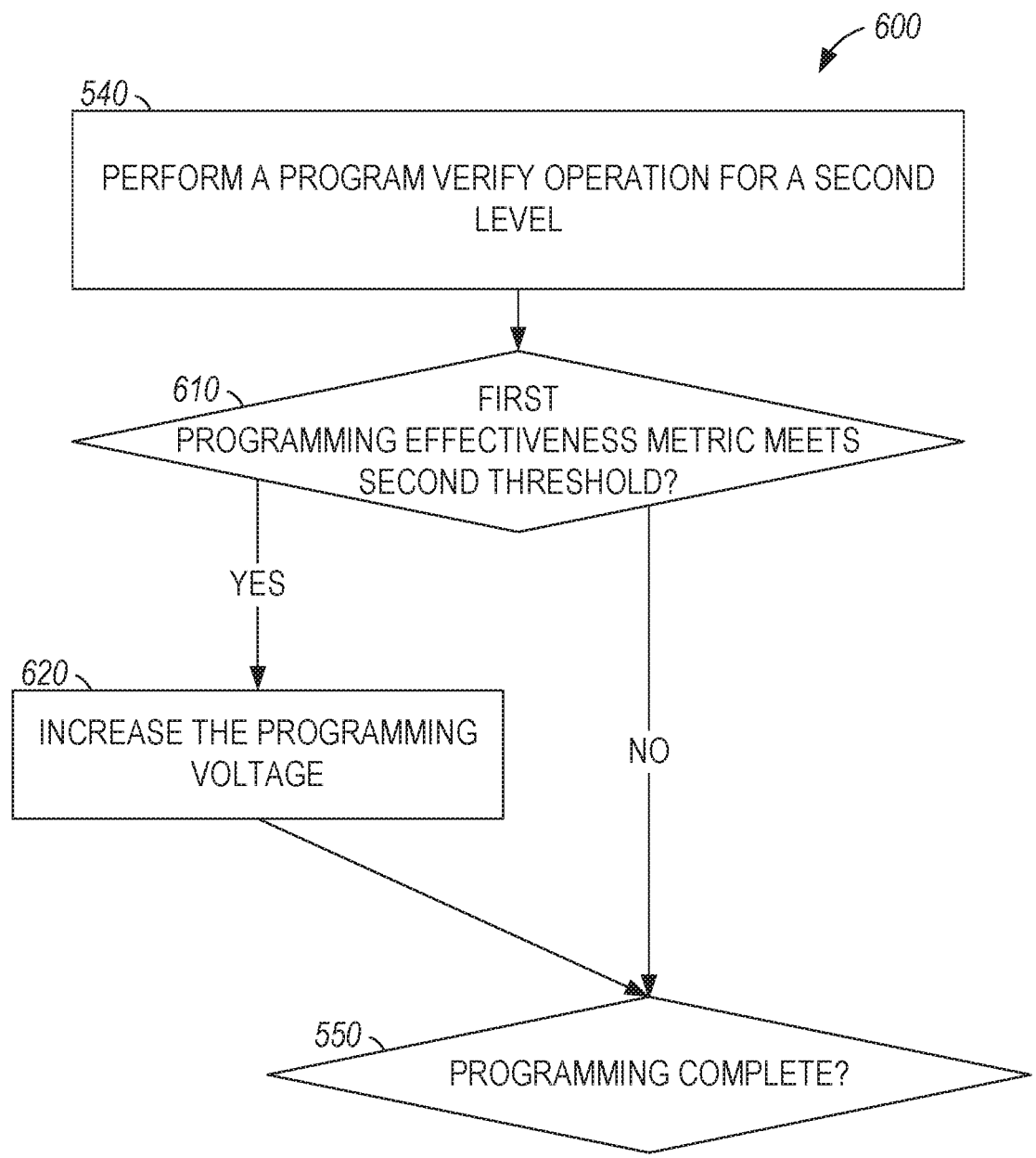
FIG. 6 is a flow chart showing operations of a method performed by a circuit in reducing program verifies for multi-level NAND cells, in accordance with some embodiments of the present disclosure.

FIG. 6 is a flow chart showing operations of a method 600 performed by a circuit in reducing program verifies for multi-level NAND cells, in accordance with some embodiments of the present disclosure. The method 600 includes operations 540, 610, 620, and 550. By way of example and not limitation, the method 600 is described as being performed by the devices of FIGS. 1-4.

As discussed above, the method 500 may be performed iteratively, with operations 510-550 repeated until all levels are successfully programmed. In some example embodiments, operations 610 and 620 are inserted between operations 540 and 550.

In operation 610, the program control 160 compares the first programming effectiveness metric determined in operation 520 to a second threshold. If the second threshold is met, the programming voltage is increased in operation 620. Otherwise, the method 600 proceeds with operation 550.

In this way, verification of programming to a second level (in operation 540) is delayed until at least a first predetermined threshold of the line is successfully programmed to a first level and, when at least a second predetermined threshold (e.g., 50%, 60%, 70%, 80%, or 90%) of the group of cells are successfully programmed to the first level, the programming voltage is increased. Increasing the programming voltage improves the chances of programming cells to a higher voltage level but runs the risk of over-programming cells to be programmed to a lower voltage level. By waiting until at least the second threshold amount of the cells have been successfully programmed to the first level (and thus are biased against programming in future iterations) before raising the programming voltage, the risk of over-programming is reduced, reducing the error rate. By not waiting until 100% of the cells have been successfully programmed to the first level, the number of iterations required to complete the programming is reduced, improving responsiveness.

As described above, the method 600 is performed by the program control 160 of the controller 140, controlling the memory device 130 within a memory system 110. Alternatively, the method 600 may be performed by the memory control unit 430 within the memory device 400, communicating with memory controller (e.g., the controller 140).

Figure 7:
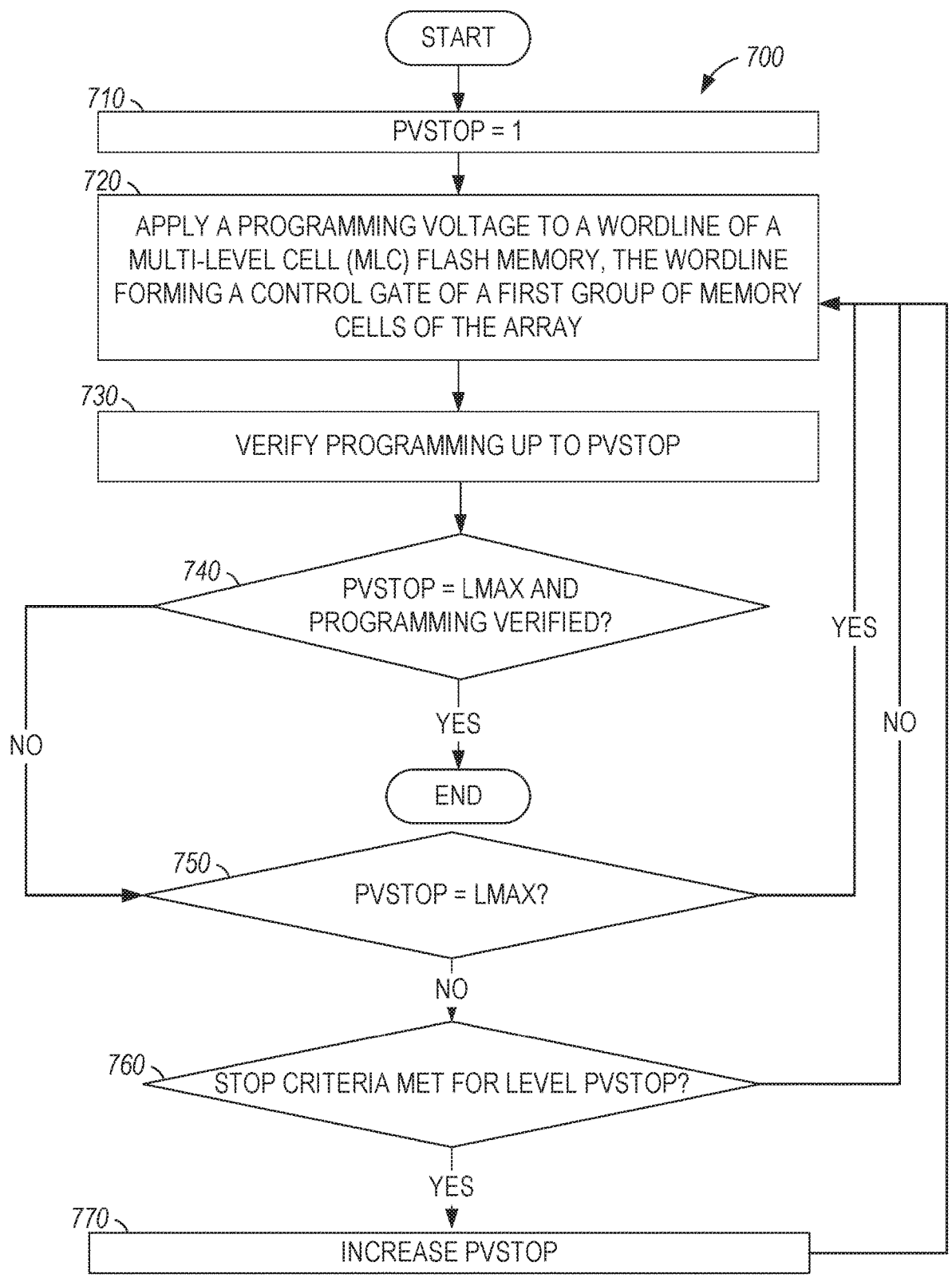
FIG. 7 is a flow chart showing operations of a method performed by a circuit in reducing program verifies for multi-level NAND cells, in accordance with some embodiments of the present disclosure.

FIG. 7 is a flow chart showing operations of a method 700 performed by a circuit in reducing program verifies for multi-level NAND cells, in accordance with some embodiments of the present disclosure. The method 700 includes operations 710, 720, 730, 740, 750, 760, and 770. By way of example and not limitation, the method 700 is described as being performed by the devices of FIGS. 1-4.

A PVSTOP variable is initialized to 1 in operation 710. This variable controls the verification step later in the method 700.

In operation 720, the program control 160 applies a programming voltage to a wordline of MLC flash memory (e.g., the wordline 317 of FIG. 3), the wordline forming a control gate of a first group of memory cells of the array. As discussed above with respect to FIG. 3, while the program voltage (e.g., 15V) is applied to the selected wordlines, a potential, such as a ground potential, can be applied to the bitlines and substrates (and thus the channels, between the sources and drains) of the memory cells targeted for programming, resulting in a charge transfer from the channels to the charge storage elements of the targeted memory cells. Simultaneously, a pass voltage or an inhibit voltage (e.g., a voltage equal to the program voltage) can be applied to bitlines having memory cells that are not targeted for programming to inhibit charge from being transferred from the channels to the charge storage elements of such non-targeted memory cells.

The program control 160 verifies, in operation 730, an amount of the group of cells that were successfully programmed to the level of PVSTOP and below. Thus, in the first iteration, the program control 160 verifies a first amount of the group of cells that were successfully programmed to a first level by the programming voltage only. In an iteration in which PVSTOP=LMAX, the maximum number of levels for the MLCs of the group of cells, amounts of the group of cells that were successfully programmed to each level are determined.

If, in operation 740, PVSTOP is equal to LMAX (i.e., if verification was performed for all levels) and the programming at all levels has been verified, then programming is complete and the method 700 ends. Otherwise, the method 700 proceeds with operation 750.

If PVSTOP is already equal to L MAX in operation 750, the next iteration begins and the method 700 returns to operation 720. Otherwise, the method 700 proceeds with operation 760.

In operation 760, if the stop criteria have not been met for the PVSTOP level, then few cells at the next level will have been successfully programmed and the next iteration is begun (at operation 720) without changing PVSTOP. However, if the stop criteria have been met for the PVSTOP level, the program control 160 increases PVSTOP (operation 770) before beginning the next iteration. In this case, since PVSTOP has been increased, operation 730 will attempt to verify the higher programming level during the next iteration.

As described above, the method 700 is performed by the program control 160 of the controller 140, controlling the memory device 130 within a memory system 110. Alternatively, the method 700 may be performed by the memory control unit 430 within the memory device 400, communicating with memory controller (e.g., the controller 140).

Figure 8:
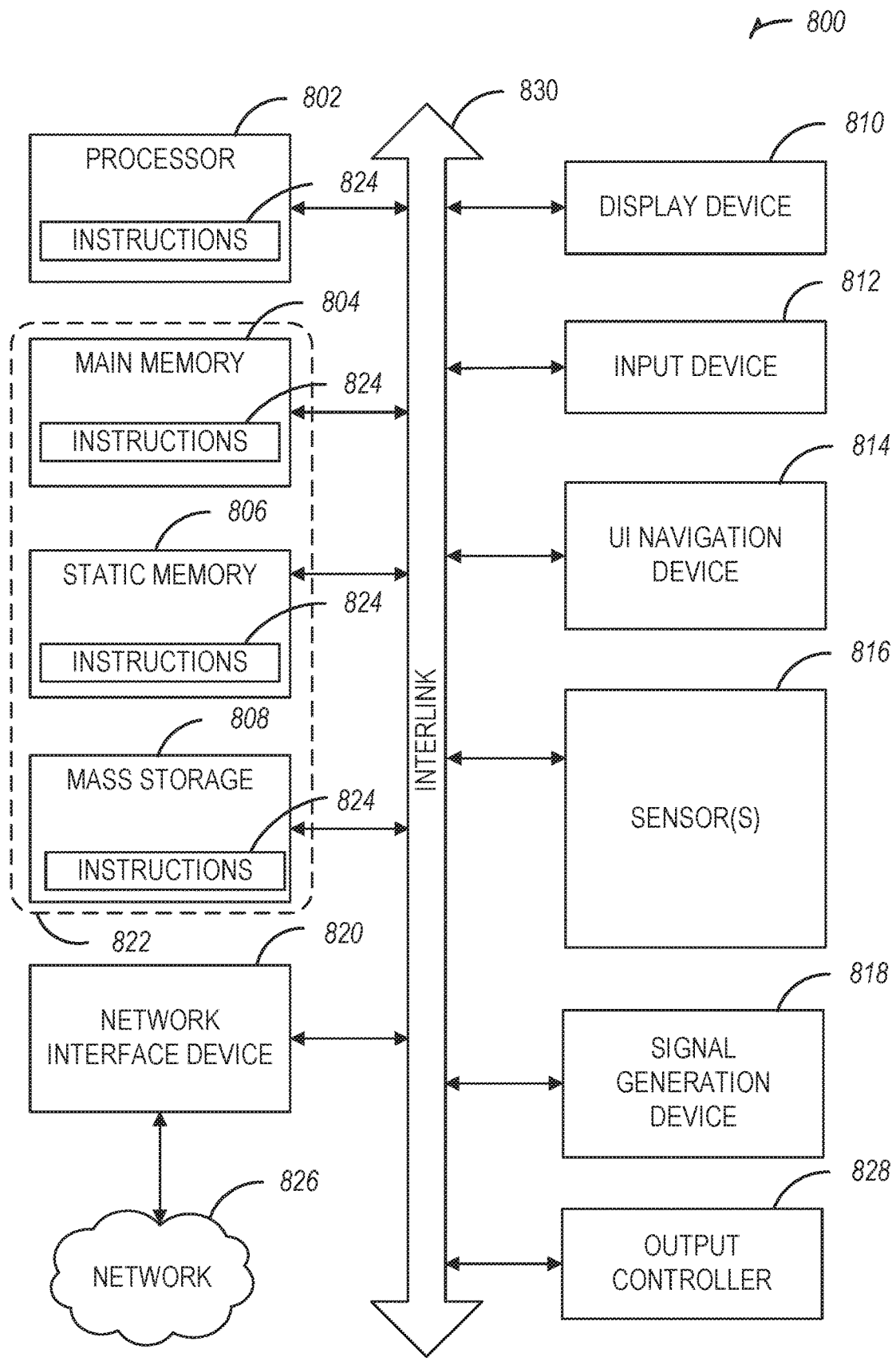
FIG. 8 is a block diagram of an example computer system in which embodiments of the present disclosure may operate.

FIG. 8 illustrates a block diagram of an example machine 800 upon which any one or more of the techniques (e.g., methodologies) discussed herein may perform. Examples, as described herein, may include, or may operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine-readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time. Additional examples of these components with respect to the machine 800 follow.

In alternative embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in peer-to-peer (P2P) (or other distributed) network environment. The machine 800 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 800 may include a hardware processor 802 (e.g., a central processing unit (CPU), a graphics processing unit (GPU), a hardware processor core, or any combination thereof), a main memory 804, a static memory (e.g., memory or storage for firmware, microcode, a basic-input-output (BIOS), unified extensible firmware interface (UEFI), etc.) 806, and mass storage 808 (e.g., hard drives, tape drives, flash storage, or other block devices) some or all of which may communicate with each other via an interlink (e.g., bus) 830. The machine 800 may further include a display unit 810, an alphanumeric input device 812 (e.g., a keyboard), and a user interface (UI) navigation device 814 (e.g., a mouse). In an example, the display unit 810, input device 812 and UI navigation device 814 may be a touch screen display. The machine 800 may additionally include a storage device (e.g., drive unit) 808, a signal generation device 818 (e.g., a speaker), a network interface device 820, and one or more sensors 816, such as a global positioning system (GPS) sensor, compass, accelerometer, or other sensor. The machine 800 may include an output controller 828, such as a serial (e.g., USB), parallel, or other wired or wireless (e.g., infrared (IR), near field communication (NFC), etc.) connection to communicate or control one or more peripheral devices (e.g., a printer, card reader, etc.).

Registers of the processor 802, the main memory 804, the static memory 806, or the mass storage 808 may be, or include, a machine-readable medium 822 on which is stored one or more sets of data structures or instructions 824 (e.g., software) embodying or utilized by any one or more of the techniques or functions described herein. The instructions 824 may also reside, completely or at least partially, within any of registers of the processor 802, the main memory 804, the static memory 806, or the mass storage 808 during execution thereof by the machine 800. In an example, one or any combination of the hardware processor 802, the main memory 804, the static memory 806, or the mass storage 808 may constitute the machine-readable media 822. While the machine-readable medium 822 is illustrated as a single medium, the term "machine-readable medium" may include a single medium or multiple media (e.g., a centralized or distributed database, and/or associated caches and servers) configured to store the one or more instructions 824.

The machine-readable medium 822 may be implemented as the storage media 148 of FIG. 1 or a component of the memory control unit 430 of FIG. 4.

The term "machine-readable medium" may include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine-readable medium examples may include solid-state memories, optical media, magnetic media, and signals (e.g., radio frequency signals, other photon-based signals, sound signals, etc.). In an example, a non-transitory machine-readable medium comprises a machine-readable medium with a plurality of particles having invariant (e.g., rest) mass, and thus are compositions of matter. Accordingly, non-transitory machine-readable media are machine-readable media that do not include transitory propagating signals. Specific examples of non-transitory machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine-readable medium 822 may be representative of the instructions 824, such as instructions 824 themselves or a format from which the instructions 824 may be derived. This format from which the instructions 824 may be derived may include source code, encoded instructions (e.g., in compressed or encrypted form), packaged instructions (e.g., split into multiple packages), or the like. The information representative of the instructions 824 in the machine-readable medium 822 may be processed by processing circuitry into the instructions to implement any of the operations discussed herein. For example, deriving the instructions 824 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 may include assembly, compilation, or interpretation of the information (e.g., by the processing circuitry) to create the instructions 824 from some intermediate or preprocessed format provided by the machine-readable medium 822. The information, when provided in multiple parts, may be combined, unpacked, and modified to create the instructions 824. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 824 may be further transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 may include one or more physical jacks (e.g., Ethernet, coaxial, or phone jacks) or one or more antennas to connect to the communications network 826. In an example, the network interface device 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine readable medium.

In the foregoing specification, some example implementations of the disclosure have been described. The specification and drawings are, accordingly, to be regarded in an illustrative sense rather than in a restrictive sense. Below is a non-exhaustive list of examples of implementations of the present disclosure.

Example 1. A system comprising:
a multi-level cell (MLC) NAND flash memory array; and a memory controller coupled to the MLC NAND flash memory array and configured to perform programming operations on the MLC NAND flash memory array, comprising:

applying a first programming voltage to a first wordline of the MLC NAND flash memory array during a first programming operation, the wordline forming a control gate of a first group of memory cells of the array;

performing a first verify operation to determine a first programming effectiveness metric comprising a first amount of the first group of memory cells that were successfully programmed to a first level in response to the first programming voltage; and based on the first programming effectiveness metric and a predetermined threshold, determining whether to perform a second verify operation to determine a second programming effectiveness metric comprising a second amount of the first group of memory cells that were successfully programmed to a second level by the first programming voltage.

Example 2. The system of example 1, wherein the operations further comprise:

performing the second verify operation to determine the second programming effectiveness metric; and based on the second programming effectiveness metric and the predetermined threshold, determining whether to perform a third verify operation to determine a third programming effectiveness metric comprising a third amount of the first group of memory cells that were successfully programmed to a third level by the first programming voltage.

Example 3. The system of example 1 or example 2, wherein the operations further comprise:

receiving, via a bus, the predetermined threshold.

Example 4. The system of any one of examples 1 to 3, wherein the first amount of the first group of memory cells is a number of the first group of memory cells that were successfully programmed to the first level.

Example 5. The system of any one of examples 1 to 4, wherein the first amount of the first group of memory cells is a percentage of the first group of memory cells that were successfully programmed to the first level.

Example 6. The system of any one of examples 1 to 5, wherein the operations further comprise:

based on the first programming effectiveness metric and a second predetermined threshold, applying a second programming voltage to the line of the MLC flash memory, the second programming voltage being higher than the first programming voltage.

Example 7. The system of any one of examples 1 to 6, wherein the MLC NAND flash memory array comprises vertical strings of memory cells with memory cells at multiple vertically disposed layers, in which multiple memory cells at a respective layer are coupled to a respective wordline.

Example 8. A non-transitory machine-readable medium that stores instructions that, when executed by a system, cause the system to perform operations comprising:

applying a first programming voltage to a first wordline of an MLC NAND flash memory array during a first programming operation, the wordline forming a control gate of a first group of memory cells of the array;

performing a first verify operation to determine a first programming effectiveness metric comprising a first amount of the first group of memory cells that were successfully programmed to a first level in response to the first programming voltage; and based on the first programming effectiveness metric and a predetermined threshold, determining whether to perform a second verify operation to determine a second programming effectiveness metric comprising a second amount of the first group of memory cells that were successfully programmed to a second level by the first programming voltage.

Example 9. The non-transitory machine-readable medium of example 8, wherein the operations further comprise:

performing the second verify operation to determine the second programming effectiveness metric; and based on the second programming effectiveness metric and the predetermined threshold, determining whether to perform a third verify operation to determine a third programming effectiveness metric comprising a third amount of the first group of memory cells that were successfully programmed to a third level by the first programming voltage.

Example 10. The non-transitory machine-readable medium of example 8 or example 9, wherein the operations further comprise:

receiving, via a bus, the predetermined threshold.

Example 11. The non-transitory machine-readable medium of any one of examples 8 to 10, wherein the first amount of the first group of memory cells is a number of the first group of memory cells that were successfully programmed to the first level.

Example 12. The non-transitory machine-readable medium of any one of examples 8 to 11, wherein the first amount of the first group of memory cells is a percentage of the first group of memory cells that were successfully programmed to the first level.

Example 13. The non-transitory machine-readable medium of any one of examples 8 to 12, wherein the operations further comprise:

based on the first programming effectiveness metric and a second predetermined threshold, applying a second programming voltage to the line of the MLC flash memory, the second programming voltage being higher than the first programming voltage.

Example 14. The non-transitory machine-readable medium of any one of examples 8 to 13, wherein the MLC NAND flash memory array comprises vertical strings of memory cells with memory cells at multiple vertically disposed layers, in which multiple memory cells at a respective layer are coupled to a respective wordline.

Example 15. A method comprising:

applying a first programming voltage to a first wordline of an MLC NAND flash memory array during a first programming operation, the wordline forming a control gate of a first group of memory cells of the array;

performing a first verify operation to determine a first programming effectiveness metric comprising a first amount of the first group of memory cells that were successfully programmed to a first level in response to the first programming voltage; and based on the first programming effectiveness metric and a predetermined threshold, determining whether to perform a second verify operation to determine a second programming effectiveness metric comprising a second amount of the first group of memory cells that were successfully programmed to a second level by the first programming voltage.

Example 16. The method of example 15, wherein the operations further comprise:

performing the second verify operation to determine the second programming effectiveness metric; and based on the second programming effectiveness metric and the predetermined threshold, determining whether to perform a third verify operation to determine a third programming effectiveness metric comprising a third amount of the first group of memory cells that were successfully programmed to a third level by the first programming voltage.

Example 17. The method of example 15 or example 16, further comprising:
receiving, via a bus, the predetermined threshold.

Example 18. The method of any one of examples 15 to 17, wherein the first amount of the first group of memory cells is a number of the first group of memory cells that were successfully programmed to the first level.

Example 19. The method of any one of examples 15 to 18, wherein the first amount of the first group of memory cells is a percentage of the first group of memory cells that were successfully programmed to the first level.

Example 20. The method of any one of examples 15 to 19, further comprising:
based on the first programming effectiveness metric and a second predetermined threshold, applying a second programming voltage to the line of the MLC flash memory, the second programming voltage being higher than the first programming voltage.

What is claimed is:

1. A system comprising:
a multi-level cell (MLC) NAND flash memory array; and
a memory controller coupled to the MLC NAND flash memory array and configured to perform programming operations on the MLC NAND flash memory array, comprising:
applying, at a first time, a single-valued first programming voltage to a wordline of the MLC NAND flash memory array during a first programming operation, the wordline forming a control gate of a first group of memory cells of the MLC NAND flash memory array;
performing a first verify operation to determine a first programming effectiveness metric comprising a first amount of the first group of memory cells that were successfully programmed to a first level in response to the first programming voltage at the first time; and
based on the first programming effectiveness metric and a predetermined threshold, determining whether to perform a second verify operation to determine a second programming effectiveness metric comprising a second amount of the first group of memory cells that were successfully programmed to a second level by the first programming voltage at the first time.

2. The system of claim 1, wherein the operations further comprise:
performing the second verify operation to determine the second programming effectiveness metric; and
based on the second programming effectiveness metric and the predetermined threshold, determining whether to perform a third verify operation to determine a third programming effectiveness metric comprising a third amount of the first group of memory cells that were successfully programmed to a third level by the first programming voltage.

3. The system of claim 1, wherein the operations further comprise:
receiving, via a bus, the predetermined threshold.

4. The system of claim 1, wherein the first amount of the first group of memory cells is a number of the first group of memory cells that were successfully programmed to the first level.

5. The system of claim 1, wherein the first amount of the first group of memory cells is a percentage of the first group of memory cells that were successfully programmed to the first level.

6. The system of claim 1, wherein the operations further comprise:
based on the first programming effectiveness metric and a second predetermined threshold, applying, at a second time, a second programming voltage to the wordline of the MLC flash memory, the second programming voltage being higher than the first programming voltage.

7. The system of claim 1, wherein the MLC NAND flash memory array comprises vertical strings of memory cells with memory cells at multiple vertically disposed layers, in which multiple memory cells at a respective layer are coupled to a respective wordline.

8. A non-transitory machine-readable medium that stores instructions that, when executed by a system, cause the system to perform operations comprising:
applying, at a first time, a single-valued first programming voltage to a wordline of an MLC NAND flash memory array during a first programming operation, the wordline forming a control gate of a first group of memory cells of the MLC NAND flash memory array;
performing a first verify operation to determine a first programming effectiveness metric comprising a first amount of the first group of memory cells that were successfully programmed to a first level in response to the first programming voltage at the first time; and
based on the first programming effectiveness metric and a predetermined threshold, determining whether to perform a second verify operation to determine a second programming effectiveness metric comprising a second amount of the first group of memory cells that were successfully programmed to a second level by the first programming voltage at the first time.

9. The non-transitory machine-readable medium of claim 8, wherein the operations further comprise:
performing the second verify operation to determine the second programming effectiveness metric; and
based on the second programming effectiveness metric and the predetermined threshold, determining whether to perform a third verify operation to determine a third programming effectiveness metric comprising a third amount of the first group of memory cells that were successfully programmed to a third level by the first programming voltage.

10. The non-transitory machine-readable medium of claim 8, wherein the operations further comprise:
receiving, via a bus, the predetermined threshold.

11. The non-transitory machine-readable medium of claim 8, wherein the first amount of the first group of memory cells is a number of the first group of memory cells that were successfully programmed to the first level.

12. The non-transitory machine-readable medium of claim 8, wherein the first amount of the first group of memory cells is a percentage of the first group of memory cells that were successfully programmed to the first level.

13. The non-transitory machine-readable medium of claim 8, wherein the operations further comprise:
based on the first programming effectiveness metric and a second predetermined threshold, applying, at a second time, a second programming voltage to the wordline of the MLC flash memory, the second programming voltage being higher than the first programming voltage.

14. The non-transitory machine-readable medium of claim 8, wherein the MLC NAND flash memory array comprises vertical strings of memory cells with memory cells at multiple vertically disposed layers, in which multiple memory cells at a respective layer are coupled to a respective wordline.

15. A method comprising:
applying, at a first time, a single-valued first programming voltage to a wordline of an MLC NAND flash memory array during a first programming operation, the wordline forming a control gate of a first group of memory cells of the MLC NAND flash memory array;
performing a first verify operation to determine a first programming effectiveness metric comprising a first amount of the first group of memory cells that were successfully programmed to a first level in response to the first programming voltage at the first time; and
based on the first programming effectiveness metric and a predetermined threshold, determining whether to perform a second verify operation to determine a second programming effectiveness metric comprising a second amount of the first group of memory cells that were successfully programmed to a second level by the first programming voltage at the first time.

16. The method of claim 15, further comprising:
performing the second verify operation to determine the second programming effectiveness metric; and
based on the second programming effectiveness metric and the predetermined threshold, determining whether to perform a third verify operation to determine a third programming effectiveness metric comprising a third amount of the first group of memory cells that were successfully programmed to a third level by the first programming voltage.

17. The method of claim 15, further comprising:
receiving, via a bus, the predetermined threshold.

18. The method of claim 15, wherein the first amount of the first group of memory cells is a number of the first group of memory cells that were successfully programmed to the first level.

19. The method of claim 15, wherein the first amount of the first group of memory cells is a percentage of the first group of memory cells that were successfully programmed to the first level.

20. The method of claim 15, further comprising:
based on the first programming effectiveness metric and a second predetermined threshold, applying, at a second time, a second programming voltage to the wordline of the MLC flash memory, the second programming voltage being higher than the first programming voltage.

* * * * *